US006285064B1

(12) United States Patent
Foster

(10) Patent No.: US 6,285,064 B1
(45) Date of Patent: Sep. 4, 2001

(54) CHIP SCALE PACKAGING TECHNIQUE FOR OPTICAL IMAGE SENSING INTEGRATED CIRCUITS

(75) Inventor: Ronald R. Foster, Los Gatos, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/536,890

(22) Filed: Mar. 28, 2000

(51) Int. Cl.[7] .................. H01L 31/0203; H01L 21/44
(52) U.S. Cl. .................. 257/433; 438/64; 438/118; 438/127; 257/432
(58) Field of Search .................. 438/127, 118, 438/64, 69; 257/466, 433, 432, 435, 436, 233, 452, 294

(56) References Cited

U.S. PATENT DOCUMENTS 5,225,935 * 7/1993 Watanabe et al. .

FOREIGN PATENT DOCUMENTS

09159806 * 6/1997 (JP) .

* cited by examiner

Primary Examiner—Caridad Everhart
(74) Attorney, Agent, or Firm—Blakely Sokoloff Taylor & Zafman, LLP

(57) ABSTRACT

A chip scale packaging for optical image sensor integrated circuits is disclosed. Micro lenses are placed on top of a wafer having the image sensors formed thereon. An adhesive matrix is placed atop of the wafer. The adhesive matrix has openings that align with the micro lensed sensor array on top of the wafer. A cover glass is then placed over the adhesive and the adhesive is activated to secure the cover glass to the wafer. Because the adhesive has openings above the micro lensed portion no distortion or reduction of the lens effect is caused by the adhesive.

4 Claims, 2 Drawing Sheets

CHIP SCALE PACKAGING TECHNIQUE FOR OPTICAL IMAGE SENSING INTEGRATED CIRCUITS

BACKGROUND OF THE INVENTION

1. Field of the Invention

The present invention is related to image sensing integrated circuits, and more particularly, to a method for chip scale packaging using an adhesive matrix.

2. Background Information

Currently, prior art chip scale packaging for optical image sensor devices require that a wafer be completely coated with an optically clear adhesive and subsequently covered with a transparent covering material. Typically, the optically clear adhesive can be an epoxy and the transparent material is glass.

However, nearly all image sensors require the application of micro lenses to increase the optical fill factor to meet performance objectives. As seen in FIG. 1, a typical chip scale package for an imaging sensor is shown. The packaging technique includes a wafer 101 having the image sensor chips formed thereon. Micro lenses 103 are formed atop of the wafer 101 to cover each pixel (picture element) individually. After pads have been extended into the scribe lines, an adhesive layer 105 is then applied, typically using some type of homogenous spin coating technique. Finally, a cover glass 107 is applied to the adhesive. The adhesive 105 serves to secure the cover glass 107 to the wafer 101. Typically, the adhesive 105 is an epoxy.

Next, the backside of the wafer 101 is ground down to make the wafer thinner. Next a wafer sawing operation is used to expose the extended image sensor electrical leads though the back side of the thinned wafer. The exposed leads are then extended to form electrical contacts with traditional deposition and etching processes. Finally, a die cutting machine is used to cut the wafer 101 into individual image sensors.

However, this prior art method of chip scale packaging is problematical for image sensors because the refractive index of the micro lens material is very similar to the adhesive 105. Thus, the adhesive 105 tends to counteract the optical effect of the micro lenses 103.

SUMMARY OF THE INVENTION

The present invention is a chip scale packaging method for optical image sensor integrated circuits. Micro lenses are placed on top of a wafer having the image sensors formed thereon. An adhesive matrix such as epoxy is placed atop of the wafer. The matrix has openings that align with the image-sensing array of the integrated circuit on top of the wafer. A cover glass is then placed over the matrix and the adhesive is activated to secure the cover glass to the wafer. Because the adhesive has openings above the micro lenses, no distortion is caused by the adhesive.

DETAILED DESCRIPTION

Figure 1:
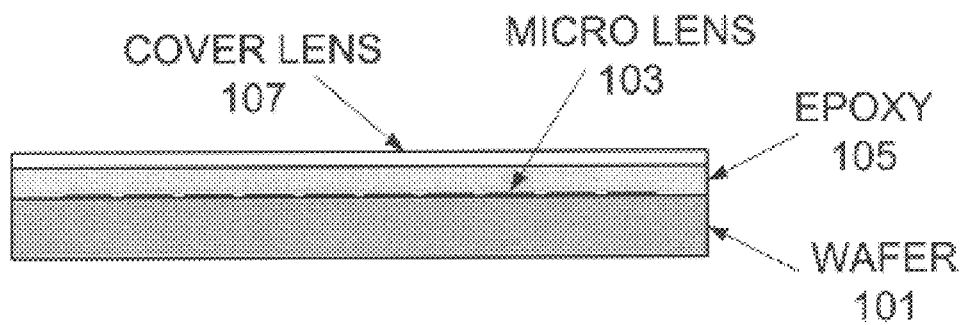
FIG. 1 is a prior art chip scale packaging technique for image sensor integrated circuits.
Figure 2:
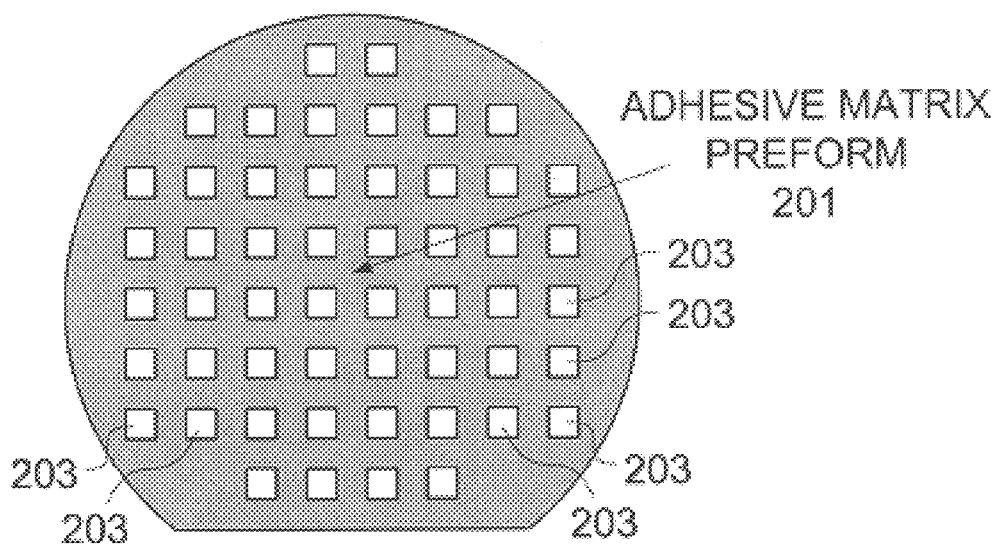
FIG. 2 is a top view of a matrix formed in accordance with the present invention.
Figure 3:
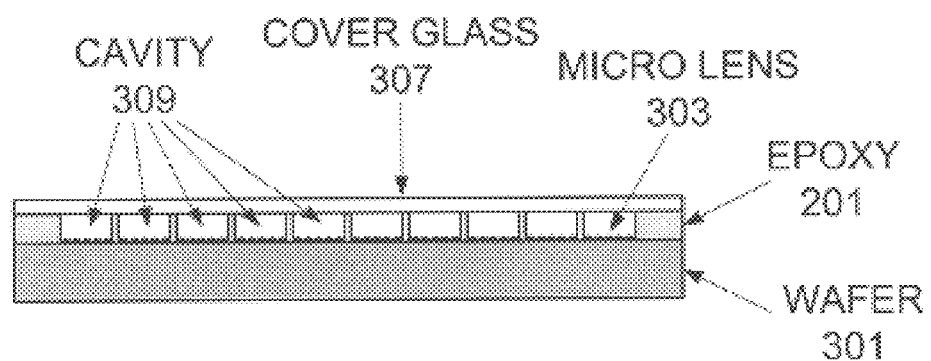
FIG. 3 is a cross-sectional view of a chip scale packaging for image sensors formed in accordance with the present invention.

In accordance with the present invention, an adhesive matrix is used to adhere a cover glass to a wafer having image sensors formed thereon. Specifically, turning to FIG. 2, an adhesive matrix 201 is provided. The adhesive matrix 201 is also referred to as a preform. The adhesive matrix 201 includes openings 203. The openings 203 are formed to coincide with the locations on a wafer that contain micro lenses.

Figure 4:
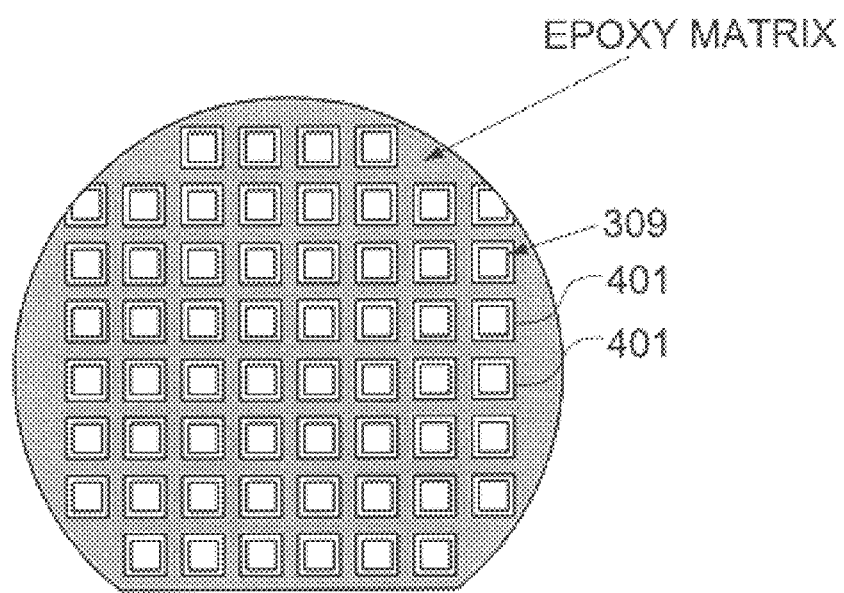
FIG. 4 is a top view of the chip scale packaging shown in FIG. 3.

Thus, as seen in FIG. 4, the openings 203 are aligned with and are placed atop of the micro lenses 303 formed atop of a wafer 301. When the adhesive matrix 201 is laid atop of the wafer 301, the openings 203 are aligned with the micro lenses 303. Next, a cover glass 307 is applied atop of the adhesive matrix 201. Note that the adhesive matrix 201 has substantially the same size as the wafer 301. After the cover glass 307 is placed atop of the adhesive matrix 201, the adhesive matrix 201 is activated by the application of light, pressure and/or heat. This causes the adhesive matrix 201 to secure the cover glass 307 to the wafer 301. The result is that cavities 309 are formed between the cover glass 307 and the micro lensed array 303. A top view of the chip package is shown in FIG. 4.

Additionally, as seen in FIG. 4, the outer boundaries of the image sensor are shown by reference numeral 401. Note that the lensed array 303 only covers a portion of the actual integrated circuit 401. The balance of the integrated circuit 401 is used for signal processing, and thus, is not covered by micro lenses 303. The peripheral region of the integrated circuit 401 can be covered by the adhesive of the adhesive matrix 201 without adverse effect. Following the adhesion of the cover glass 307 to the wafer 301, in accordance with the prior art, the wafer 301 can be further processed and sliced to generate individual integrated circuit devices.

By having an adhesive matrix having openings that do not cover the micro lensed sensing array, the problems of the prior art with the epoxy counteracting the effect of the micro lenses is avoided. In other words, a cavity that does not contain adhesive is formed over the micro lenses. This allows the micro lenses to perform their function without interference by the adhesive.

Indeed, other benefits from the cavities 309 formed by the use of the adhesive matrix 201 can be realized. For example, the cavities 309 may be filled with gaseous or liquid materials that further enhance the optical properties, temperature characteristics, or other performance characteristics of the imaging sensor. The filling of the cavity with gas or liquid material would precede the application of the cover glass 307. For example, a gaseous or liquid material that has a refractive index of less than one would further enhance the optical property of the micro lenses. Additionally, a gaseous or liquid material that has good heat dissipating properties may be used to dissipate heat generated by the imaging sensor, thereby increasing the performance characteristics of the image device. Finally, the adhesive material may be made opaque to enhance device performance The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For example, the adhesive matrix 201 may be of varying size to match the size of the wafer 301. In addition, the openings 203 can be of varying size to correlate with the sizes of the micro lensed array incorporated into the image sensors formed on the wafer 301. These modifications can be made to the invention in light of the above detailed description. The terms used in the following claims should not be construed to limit the invention to the specific embodiments disclosed in the specification and the claims. Rather, the scope of the invention is to be determined entirely by the following claims that are to be construed with accordance with established doctrines of claim interpretation.

For example, instead of using an adhesive preform to form the cavities, the adhesive may be applied in the required pattern with liquid dispensing equipment, or with techniques similar to screen printing.

What is claimed is:

1. A method comprising:

applying micro lenses onto a wafer, said wafer including a plurality of image sensor integrated circuits, said micro lenses being applied to a sensing array portion of said image sensor integrated circuits;

applying an adhesive matrix atop of said wafer, said adhesive matrix including a plurality of openings located to correspond to said sensing array portion when said adhesive matrix is applied to said wafer; and applying a cover glass atop of said adhesive matrix such that a cavity containing a non-adhesive material is formed over the micro lenses.

2. The method of claim 1 further including the step of activating said adhesive matrix to bind said cover glass to said wafer.

3. A chip scale package comprising:

a wafer containing a plurality of image sensor integrated circuits, said wafer having micro lenses applied thereto, one set of micro lenses for each image sensor integrated circuit;

an adhesive matrix applied to said wafer, said adhesive matrix having openings corresponding to the locations of said micro lenses; and a cover glass applied to said adhesive matrix, said adhesive matrix securing said cover glass to said wafer such that a cavity containing a non-adhesive material is formed over the micro lenses.

4. A chip scale package comprising:

a wafer containing a plurality of image sensors, each image sensor having a sensing area, said wafer having micro lenses applied thereto, one set of micro lenses for each image sensor;

an adhesive matrix applied to said wafer, said adhesive matrix having openings corresponding to the locations of said sensing areas; and a cover glass applied to said adhesive matrix, said adhesive matrix securing said cover glass to said wafer such that a cavity containing a non-adhesive material is formed over the micro lenses.

\* \* \* \* \*